US010819116B2

(12) United States Patent
Khabibrakhmanov et al.

(10) Patent No.: US 10,819,116 B2
(45) Date of Patent: Oct. 27, 2020

(54) FORECASTING SOLAR POWER GENERATION USING REAL-TIME POWER DATA

(71) Applicant: International Business Machines Corporation, Armonk, NY (US)

(72) Inventors: Ildar Khabibrakhmanov, Syosset, NY (US); Tarun Kumar, Mohegan Lake, NY (US); Mark A. Lavin, Katonah, NY (US); Rui Zhang, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 797 days.

(21) Appl. No.: 15/445,218

(22) Filed: Feb. 28, 2017

(65) Prior Publication Data

US 2018/0248380 A1    Aug. 30, 2018

(51) Int. Cl.
*G06F 30/20* (2020.01)
*H02J 3/38* (2006.01)

(52) U.S. Cl.
CPC .............. *H02J 3/383* (2013.01); *G06F 30/20* (2020.01); *H02J 2203/20* (2020.01); *Y02A 30/12* (2018.01); *Y02E 60/76* (2013.01); *Y04S 40/22* (2013.01)

(58) Field of Classification Search
CPC .. H02J 3/383; H02J 2003/007; H02J 2203/20; H02J 3/004; H02J 3/381;
(Continued)

(56) References Cited

U.S. PATENT DOCUMENTS 7,580,817 B2 *  8/2009  Bing ........................ G01W 1/10
                                                                703/6
8,600,572 B2 * 12/2013  Sri-Jayantha .......... G06Q 50/06
                                                                700/291
(Continued)

FOREIGN PATENT DOCUMENTS

CN          103916071      *    4/2014
EP           2891904 A1         7/2015
(Continued)

OTHER PUBLICATIONS

Zibo Dong et al., "Short-term solar irradiance forecasting using exponential smoothing state space model", 2013, Energy 55, pp. 1-11.*

(Continued)

*Primary Examiner* — Juan C Ochoa
(74) *Attorney, Agent, or Firm* — Cantopr Colburn LLP; Joseph Petrokaitis

(57) ABSTRACT

Embodiments are directed to a computer-implemented method, computer system, and computer program product for forecasting power generation. The method includes receiving a first power generation forecast. A second power generation forecast is received, along with actual observed power generation. A model is created for the observed power generation based on the second power generation forecast. A third power generation forecast is created using the model for the observed power generation, the second power generation forecast, and the first power generation forecast.

6 Claims, 6 Drawing Sheets

(58) Field of Classification Search
CPC .. H02J 2300/24; G06F 17/5009; G06F 30/20; Y02E 60/76; Y02A 30/12; Y04S 40/22
USPC .......................................................... 703/18
See application file for complete search history.

(56) References Cited

U.S. PATENT DOCUMENTS

| | | | |
|---|---|---|---|
| 8,930,035 | B2 | 1/2015 | Marroyo et al. |
| 9,007,460 | B2 | 4/2015 | Schmidt et al. |
| 9,053,439 | B2 * | 6/2015 | Marwah .................. H02S 50/00 |
| 9,069,103 | B2 | 6/2015 | Williams et al. |
| 9,322,951 | B2 | 4/2016 | Herzig et al. |
| 9,348,394 | B2 | 5/2016 | Harper, III et al. |
| 10,488,829 | B2 * | 11/2019 | Sun ........................ G05B 13/02 |
| 2010/0198420 | A1 | 8/2010 | Rettger et al. |
| 2011/0276269 | A1 | 11/2011 | Hummel |
| 2011/0282514 | A1 | 11/2011 | Ropp et al. |
| 2012/0143856 | A1 | 6/2012 | Klinkigt et al. |
| 2012/0166085 | A1 | 6/2012 | Gevorkian |
| 2013/0024170 | A1 | 1/2013 | Dannecker et al. |
| 2014/0095076 | A1 | 4/2014 | Marwah et al. |
| 2014/0129040 | A1 | 5/2014 | Emadi et al. |
| 2014/0136178 | A1 | 5/2014 | Meagher et al. |
| 2014/0148963 | A1 | 5/2014 | Ozog |
| 2014/0195159 | A1 * | 7/2014 | Mewes .................. G01R 21/00 |
| | | | 702/3 |
| 2014/0207298 | A1 | 7/2014 | Gupta et al. |
| 2014/0278107 | A1 | 9/2014 | Kerrigan et al. |
| 2015/0134251 | A1 | 5/2015 | Bixel |
| 2015/0177415 | A1 | 6/2015 | Bing |
| 2015/0186904 | A1 | 7/2015 | Guha et al. |
| 2016/0371412 | A1 | 12/2016 | Marie et al. |
| 2017/0003352 | A1 | 1/2017 | Barre et al. |
| 2017/0005515 | A1 | 1/2017 | Sanders et al. |
| 2017/0017215 | A1 * | 1/2017 | Shimizu ............. G06Q 10/0631 |
| 2017/0220708 | A1 * | 8/2017 | He ........................... G01W 1/12 |
| 2017/0286838 | A1 | 10/2017 | Cipriani et al. |

FOREIGN PATENT DOCUMENTS

| | | |
|---|---|---|
| WO | 2010096783 A1 | 8/2010 |
| WO | 2013169903 A1 | 11/2013 |
| WO | 2015180074 A1 | 12/2015 |

OTHER PUBLICATIONS

Charles C. Holt, "Forecasting seasonals and trends by exponentially weighted moving averages", 2004, International journal of forecasting 20.1, pp. 5-10.*

Adrian N. Dunea et al., "Forecasting methods used for performance's simulation and optimization of photovoltaic grids", 2001, IEEE Porto Power Tech Proceedings (Cat. No. 01EX502) vol. 4., pp. 1-5.*

"Classification and Regression Trees", Quest, https://support.quest.com/technical-documents/statistics/current/textbook/9#TOPIC-322242 (retrieved Feb. 28, 2017), 14 pages.

Chow et al., "Intra-hour forecasting with a total sky imager at the UC San Diego solar energy testbed", Solar Energy, vol. 85, Issue 11, Nov. 2011, pp. 2881-2893.

Pelland et al., "Photovoltaic and Solar Forecasting: State of the Art", Report IEA-PVPS T14-01: 2013, Oct. 2013, 40 pages.

Sharma et al., "Predicting Solar Generation from Weather Forecasts Using Machine Learning", 2011 IEEE International Conference on Smart Grid Communications (SmartGridComm), Oct. 2011, pp. 528-533.

Khabibrakhmanov et al., "Forecasting Solar Power Generation Using Real-Time Power Data," U.S. Appl. No. 15/288,707, filed Oct. 7, 2016.

Khabibrakhmanov et al., "Forecasting Solar Power Generation Using Weather Forecasts," U.S. Appl. No. 15/288,571, filed Oct. 7, 2016.

List of IBM Patents or Patent Applications Treated as Related; Date Filed: Feb. 28, 2017, 2 pages.

Batista, et al., "A Complexity-Invariant Distance Measure for Time Series", Proceedings of the eleventh SIAM conference on data mining (SDM), 12 Pages, 2011.

Lorenz, et al., "Irradiance Forecasting for the Power Prediction of Grid-Connected Photovoltaic Systems", IEEE Journal of Selected Topics in Applied Earth Observations and Remote Sensing, vol. 2, No. 1, Mar. 2009, 9 Pages, IEEE.

Roscoe, A., et al; "Supporting high penetrations of renewable generation via implementation of real-time electricity pricing and demand response", IET Renewable Power Generation, vol. 4, Issue 4 (2010), pp. 369-382.

Wintoft, P., "Real-time forecast service for geomagnetically induced currents WP 400 Technical Note Forecasting dH/dt and GIC from solar wind data", Oct. 5, 2004, 21 Pages, Publisher Unknown.

* cited by examiner

FORECASTING SOLAR POWER GENERATION USING REAL-TIME POWER DATA

BACKGROUND

The embodiments described herein relate in general to the field of power generation. More specifically, the embodiments described herein relate to systems and methodologies for forecasting the generation of solar power.

There is a great interest in replacing or augmenting electric power generation by using solar power. Solar power generation is the conversion of sunlight into electricity, typically using photovoltaic cells or concentrated solar power. An advantage of solar power is the removal of the need to discover, mine, or drill for fossil fuel sources and lower emissions. A disadvantage of solar power is that the output of a solar power plant varies based on the availability of sunlight. The availability of sunlight changes based on time of year (there is less sunlight available in the winter than in the summer), time of day (there is no sunlight available at night), and weather (cloud cover reduces the level of available sunlight).

SUMMARY

Embodiments are directed to a computer-implemented method of forecasting power generation. The method includes receiving a first power generation forecast. A second power generation forecast is received, along with actual observed power generation. A model is created for the observed power generation based on the second power generation forecast. A third power generation forecast is created using the model for the observed power generation, the second power generation forecast, and the first power generation forecast.

Embodiments are further directed to a computer system for forecasting power generation. The system includes a memory and a processor system communicatively coupled to the memory. The processor is configured to perform a method that includes receiving a first power generation forecast. A second power generation forecast is received, along with actual observed power generation. A model is created for the observed power generation based on the second power generation forecast. A third power generation forecast is created using the model for the observed power generation, the second power generation forecast, and the first power generation forecast.

Embodiments are further directed to a computer program product for forecasting power generation. The computer program product includes a computer-readable storage medium having program instructions embodied therewith, wherein the computer-readable storage medium is not a transitory signal per se. The program instructions are readable by a processor system to cause the processor system to perform a method that includes receiving a first power generation forecast. A second power generation forecast is received, along with actual observed power generation. A model is created for the observed power generation based on the second power generation forecast. A third power generation forecast is created using the model for the observed power generation, the second power generation forecast, and the first power generation forecast.

Additional features and advantages are realized through techniques described herein. Other embodiments and aspects are described in detail herein. For a better understanding, refer to the description and to the drawings.

BRIEF DESCRIPTION OF THE DRAWINGS

The subject matter that is regarded as embodiments of the invention is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
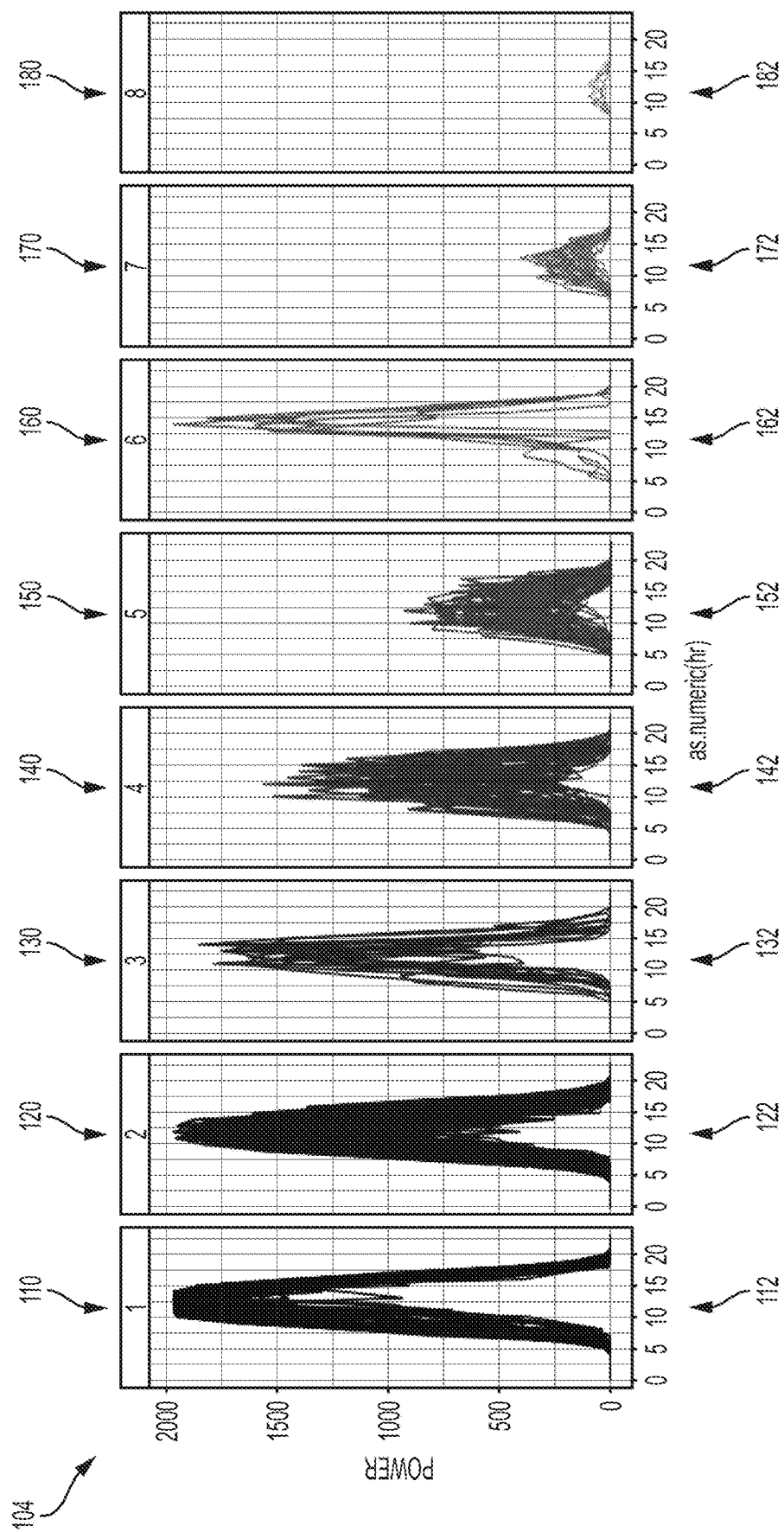
FIG. 1 depicts several exemplary clusters of power data of an exemplary embodiment.

Various embodiments of the present invention will now be described with reference to the related drawings. Alternate embodiments can be devised without departing from the scope of this invention. Various connections might be set forth between elements in the following description and in the drawings. These connections, unless specified otherwise, can be direct or indirect, and the present description is not intended to be limiting in this respect. Accordingly, a coupling of entities can refer to either a direct or an indirect connection.

Additionally, although a detailed description of a computing device is presented, configuration and implementation of the teachings recited herein are not limited to a particular type or configuration of computing device(s). Rather, embodiments are capable of being implemented in conjunction with any other type or configuration of wireless or non-wireless computing devices and/or computing environments, now known or later developed.

Furthermore, although a detailed description of presentation algorithms is included herein, implementation of the teachings recited herein are not limited to embodiments described herein. Rather, embodiments are capable of being implemented in conjunction with any other type of presentation system, now known or later developed.

At least the features and combinations of features described in the immediately present application, including the corresponding features and combinations of features depicted in the figures amount to significantly more than implementing a method of forecasting power generation based on weather forecasts. Additionally, at least the features and combinations of features described in the immediately preceding paragraphs, including the corresponding features and combinations of features depicted in the figures go beyond what is well understood, routine and conventional in the relevant field(s).

Electrical power is generated at power plants, transmitted, distributed and sold via an electric grid to locations throughout the world. Power plants use a variety of energy sources to generate electricity. The most widely used energy sources are coal, natural gas, nuclear power, hydroelectric power, wind, and solar. Because of the constant increase in power consumption throughout the world, there is an ever-increasing need for the generation of electrical power. Environmental concerns have led to the lessening of popularity of the use fossil fuels (such as coal and natural gas) as an energy source and an increase in the popularity of other energy sources. Nuclear power has its own environmental concerns, so there is increasing interest in using renewable energy sources such as solar energy.

Solar power plants convert incoming sunlight into electricity. Such a conversion can occur in a variety of ways, including the use of photovoltaics or the use of concentrated solar power to power a heat engine (such as a steam turbine) that is coupled to an electrical power generator.

One issue that occurs with solar power is that the power generated by a solar power plant can vary due to factors that are beyond human control. While fossil fuel power plants, nuclear power plants, and hydroelectric power plants can have a maximum power generation capacity, the amount that is actually generated can be controlled by humans by controlling the amount of fuel being consumed or the amount of water flowing across a turbine connected to an electrical power generator. In contrast, the maximum amount of power being generated by a solar energy power plant or a wind power plant at any given time is dependent on several factors that are beyond the control of humans (a solar energy power plant can produce less power than its full capacity merely by turning off or disconnecting some of the photovoltaic cells). These factors can include the time of day (more sunlight is available at certain times of day than others, including night time when a negligible amount of sunlight is available), time of year (there is less sunlight available in the winter than there is in the summer), and weather conditions (there is less sunlight available in cloudy weather or rainy weather than in sunny weather).

An electrical power company or utility that uses solar power will often supplement the electrical power with other power sources. The other power sources can be internal to the electrical power company (such as a fossil fuel or hydroelectric plant operated by the electrical power company), or they can be external to the electrical power company, in which case the electrical power company will purchase power from a marketplace in order to supplement the power generated by the solar energy power plant. To be able to purchase or use power to supplement a solar energy power plant, an electrical power company should be able to forecast how much power will be generated by the solar energy power plant as well as how much power will be used by its customers.

Embodiments of the present invention address the above-described problem by using a novel method and system to analyze weather data to forecast the amount of electrical power that will be generated by the solar energy power plant. Based on historical weather and solar power data, a solar power profile is trained or created with a set of clusters, each cluster representing an exemplary power profile that estimates electrical power produced in a certain time period for a given weather condition. Then, given a weather forecast, an embodiment can predict the cluster to which the weather forecast will belong, based on prior weather data. Finally, using the historical power generation of the cluster to which the weather forecast belongs, an embodiment determines a forecast the solar power being generated for the time period in question.

Other embodiments augment the above-described solution using real-time power generation data. Once the sun rises, actual power generation data for a particular day becomes available. The actual power generation data can be compared to the clusters of power generation data discussed above or to other clusters created using only power generation data. Thereafter, the estimate of power generation can be refined to reflect the actual power generation data in addition to the weather forecast data.

Because forecasting weather is very unpredictable, it has been found that previously used methods of using weather forecasts to forecast solar power generation are inaccurate. One concept that can be used to create improved estimates is the use of "clusters" of historical data. With reference to FIG. 1, a series of eight graphs, 110 through 180, is presented. For each graph, the x-axis (112, 122, 132, 142, 152, 162, 172, and 182) represents the time of day. The y-axis 104 is shared among all of the graphs and represents the amount of power generated at a particular time of day. The time is represented in 24-hour format, so that 12 on the x-axis represent noon, 15 represents 3:00 pm, and so forth. For each graph, the value of the the y-axis at x=15 is the amount of power produced at 3 pm. There is little to no power generation before 5:00 am and after 8:00 pm for each graph, though this is dependent on the season.

Each graph represents a cluster of historical data. A cluster of data means a group of days that have a similar profile of power generated over time. The clusters shown in FIG. 1 go down in power generated. Graph 110 represents a relatively sunny day in which electricity is generated at a high level throughout the day (such as a day with very little cloud cover). Graph 180 represents a day in which electricity relatively low level or not at all throughout the day (such as a cloudy or rainy day). Graphs 120 through 170 represent days between the two extremes of graph 110 and graph 180. Each of the graphs 110 through 180 also has an associated weather profile. Thus, each cluster includes both a typical weather profile and a typical power generation profile. The manner in which weather conditions are assigned to a cluster is described in further detail below.

One concept used in some embodiments is that each day (or other time period for which a weather forecast is available) can be estimated to fall within one of the clusters presented in FIG. 1. In some embodiments, a daily weather forecast is matched with a similar weather pattern found in one of the clusters. Each day that falls within the cluster represented by, for example, graph 110 has certain weather characteristics. Thus, if a forecast for a particular day has characteristics similar to the weather conditions that resulted in graph 110, the power generated for that day is more likely to follow the power profile presented in graph 110. If a forecast has characteristics similar to the weather conditions that resulted in graph 120, the power generated for that day is more likely to follow the power profile presented in graph 120. This process repeats for each of graphs 130, 140, 150, 160, 170, and 180.

Although the use of eight clusters is illustrated in FIG. 1 and the accompanying text, it should be understood that any number of clusters greater than one can be used. Through experimental use, it can be determined that a different number of clusters provide the optimal combination of accuracy and computational complexity. In addition, it should be understood that each cluster can represent power output at a specific location (such as a set of photovoltaic cells or other solar power plants). Because weather is localized, it should be clear that a power output of a solar energy power plant in Oregon will not necessarily have the same power output as a similarly sized solar energy power plant in Texas. If a power company or utility has solar energy power plants in both Oregon and Texas, they will typically run a separate algorithm for each location. Furthermore, the power generation profile can be scaled to represent the power generation capabilities of the location. For example, if a location changed the number of photovoltaic cells at a certain location, that can be accounted for in the calculations, scaling up if the location has additional photovoltaic cells that were not previously available (e.g., due to an expansion), or if the location has fewer photovoltaic cells than were previously available (e.g., due to maintenance).

Figure 2:
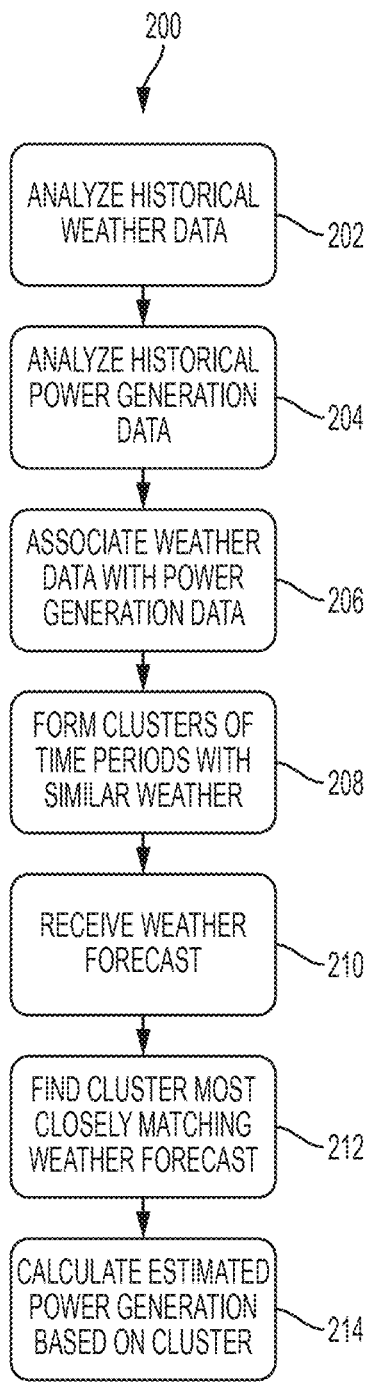
FIG. 2 depicts a flow diagram illustrating the operation of an embodiment.

Method 200 is an overview of a general method and is presented in FIG. 2. Method 200 is merely an exemplary embodiment of the present invention and is not intended to limit the scope of the invention described herein. Method 200 can be employed in many different embodiments or examples not specifically depicted or described herein. In some embodiments, the procedures, processes, and/or activities of method 200 can be performed in the order presented. In other embodiments, one or more of the procedures, processes, and/or activities of method 200 can be combined or skipped. In some embodiments, portions of method 200 can be implemented by computer system 400.

A set of historical weather data is loaded into a system (block 202). The historical weather data can contain many types of data. In some embodiments, different pieces of weather data can be loaded into a system for comparison purposes. The data can include traditional weather data such as air temperature, water temperature, humidity, dew point, wind speed, wind direction, cloud cover, barometric pressure, precipitation, pollen count, pollutant count, and the like. Statistical data regarding the same also can be accepted as input or calculated (such as mean, maximum, median, standard deviation, and rate of change). In some embodiments, up to 40 or more pieces of weather data can be used as input. A set of historical solar power generation data is loaded into the system (block 204). The historical solar power generation covers the same time period as the historical weather data is loaded. The data for both weather and solar power generation can be periodic data. As more time periods are used for each day, a more accurate daily power profile results. In some embodiments, the weather and solar power generation information can be hourly. In some embodiments, the weather and solar power generation information can cover a shorter time period (such as every 30 minutes, or 15 minutes, or 5 minutes). Any number of pieces of data can be used, with the tradeoff being that more data increases the complexity of the calculations that will be performed.

For each time period in the data sets, the weather data is associated with corresponding power generation data (block 206).

Once the power generation data and weather data is matched, clusters can be formed (block 208). The number of clusters formed can be adjusted based on the desired accuracy weighed against the computational complexity of the calculations. The clusters are grouped by similarity, with similarity being defined in further detail below. A supervised machine-learning algorithm can be used for such a purpose. An advantage of such an algorithm is that the algorithm improves each time that it is executed, because the algorithm improves each time there is more data with which to work.

Any type of machine learning algorithm can be used to generate the clusters. In some embodiments, a non-linear machine-learning algorithm is used. In some embodiments, the non-linear machine-learning algorithm is a support vector machine (SVM) algorithm. In some embodiments, it might be found that a gradient boosting machine (GBM) algorithm result in more accurate results. In other embodiments, other machine-learning algorithm might be found to be the most effective. In general, a machine-learning algorithm operates by taking known values of weather data and corresponding values of the power generation data. Then an algorithm iteratively processes the data for each time period to find an approximate relationship between the weather data and the power generation data. Any one of a variety of machine learning techniques (or combination thereof) can be used to create the clusters.

Once the clusters are generated, the training portion can be considered complete and operation can begin for daily usage. However, it should be understood that the above-described blocks can be executed each time more data is available (such as when each time period has passed). Such an iterative process can result in a more accurate formation of clusters.

For daily (or other appropriate time period) usage, a weather forecast is received (block 210). The weather forecast can include quantities such as temperature, humidity, wind speed, wind direction, cloud cover, barometric pressure, precipitation, and the like. The weather forecast can be for any time period. In some embodiments, the time period is three days, with forecast data provided in hourly increments. In some embodiments, other time periods and frequency of data is used.

The weather forecast is compared against the previously generated clusters (block 212). Each cluster includes historical weather data and historical power generation data. For each cluster, the historical weather data can be summarized. In some embodiments, the summary of historical weather data can include a mean hourly value for each weather aspect being tracked (e.g., temperature, humidity, wind speed, wind direction, cloud cover, barometric pressure, precipitation, and the like), as well as other statistical values.

Comparing the weather forecast includes finding the cluster that most closely matches the weather forecast. The comparison can be performed using a similarity calculation, such as the similarity calculations set forth in further detail below. For each cluster, a similarity score is calculated that compares the cluster with the weather forecast. The cluster with the highest similarity score is the cluster that is most similar to the weather forecast. The comparison can be performed using a supervised machine-learning algorithm. In such a manner, the forecast data can be stored for later use on future days, along with actual weather data and actual power generation data.

The comparison to previously generated clusters results in the day of the forecast being placed in one of the clusters. Thereafter, using the cluster data along with other data (such as the time of year to determine how long the sun will be up), an estimated solar power generation forecast is calculated (block 214). This can be performed in any one of a number of manners. For example, a cluster can include data for one of many different time periods, such as an hourly forecast for how much electrical power will be generated for each hour. The time periods can be set to as fine a granularity as is needed to create a desired level of precision. In other words, once it has been found that the weather forecast for a particular date is most similar to graph 120 (for example), it is estimated that the power generation for that day also follows graph 120. The estimate of power generation can be adjusted for any change to the set of photovoltaics in question.

Once the solar power forecast is generated, it can be determined how much supplemental power is needed. For example, an electrical power company typically has an estimate of how much electrical power will be needed for a particular day. This can be estimated from prior usage, weather forecasts, day of the week, and the like, in a manner now known in the art or developed in the future. Once the power usage estimate is determined, the amount of supplemental power can be determined by subtracting the power usage estimate from the power generation estimate. The electrical power utility can then arrange to have the amount of supplemental power estimated. This can be performed by buying supplemental power from other utilities, or by using other sources of power that may be available to the electrical power utility.

The concept of similarity will now be described. Similarity can be calculated in any of a variety of different manners. In some embodiments, similarity can be calculated as the product of the complexity measure of the daily power profile and the Euclidean distance of the daily power profile. In equation form, this can be expressed as shown below in Equation (1):

$$D(X_i,X_j)=CF(X_i,X_j)\cdot d(X_i,X_j)$$

Here, D represents the similarity score for a certain time period, CF represents the complexity measure, and d represents the Euclidian distance. $X_i$ and $X_j$ are the two data points being compared, one for the $i^{th}$ time period and one for the $j^{th}$ time period. In the embodiment shown in FIG. 2, the $i^{th}$ time period can be the time period for which the forecast is being made, while the $j^{th}$ time period is the cluster to which the time period is being compared. In the embodiment shown in FIG. 1, where training is taking place, $i^{th}$ time period can be the time period for which the actual data for the time period is being evaluated, while the $j^{th}$ time period is the cluster to which the time period is being compared.

The time period can be of one of a variety of different durations. In some embodiments, a power profile can be calculated for an entire day. In some embodiments, smaller time increments can be used in an attempt to create forecasts of greater precision.

The complexity measure is defined as shown below in Equation (2):

$$CF(X_i, X_j) = \frac{\max_{\square} \{CE(X_i), CE(X_j)\}}{\min_{\square} \{CE(X_i), CE(X_j)\}}$$

Here, CE represents the change from time period to time period as defined below in Equation (3):

$$CE(X_i)=\sqrt{\Sigma_{t=1}^n(X_t^i-X_{t+1}^i)^2}$$

The Euclidean distance is defined below in Equation (4):

$$d(X_i,X_j)=\sqrt{\Sigma_{t=1}^n(X_t^i-X_{t+1}^j)^2}$$

While the above description refers to the use of weather forecasts to determine solar power forecasts, it should be understood that embodiments are not so limited. Any type of power generation that is dependent on weather, such as wind power generation, can use an embodiment.

While the above-described solution has been found to be effective, there can be refinements to the solution. A weather forecast is received in advance of the day. In some embodiments, the weather forecast covers a three-day period and is received before the three-day period begins. One can update the embodiments described above in a periodic manner as new weather forecasts are received. However, it has been found that more accurate results can be obtained through the use of actual solar power data, either alone or in conjunction with the weather forecast data. A weather forecast that is received before the sun rises has no power data to confirm the accuracy of the power forecast. Using actual power data received after the sun has risen can result in a substantial improvement in the mean absolute percentage error (MAPE).

Figure 3:
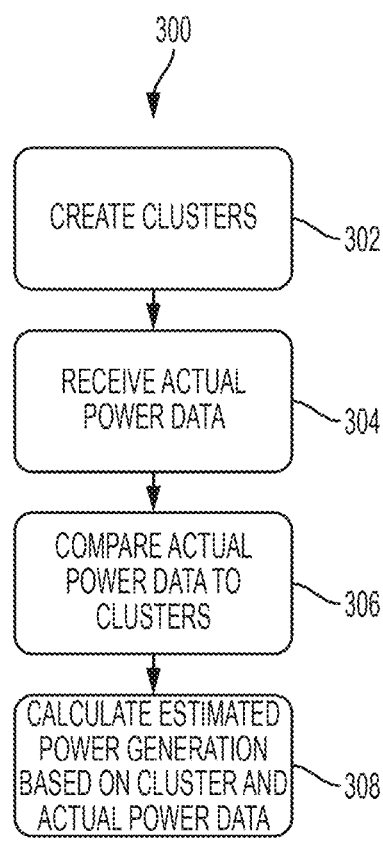
FIG. 3 depicts a flow diagram illustrating the operation of an embodiment.

Method 300 is an overview of a general method and is presented in FIG. 3. Method 300 is merely exemplary and is not limited to the embodiments presented herein. Method 300 can be employed in many different embodiments or examples not specifically depicted or described herein. In some embodiments, the procedures, processes, and/or activities of method 300 can be performed in the order presented. In other embodiments, one or more of the procedures, processes, and/or activities of method 300 can be combined or skipped. In some embodiments, portions of method 300 can be implemented by computer system 400.

A set of clusters is created (block 302). The set of clusters has one or more clusters. These clusters can be created in the manner described above with respect to blocks 202 through 208 of FIG. 2. The clusters also can be formed in any number of different manners. Each cluster of the set of clusters contains a plurality of power profiles, where each power profile has similar characteristics. Clusters can be represented as shown in graphs 110 through 180 of FIG. 1. As described above, for each graph, the estimated power produced at a certain time is shown. As discussed above, weather forecasts can be used to match a future day to a cluster to predict the power that will be generated that day.

In some embodiments, a separate set of clusters can be created that are different from the clusters described above. For example, while the example described above discusses the formation of clusters based on the similarity between both weather data and power data, other embodiments can form clusters based solely on power data. In some embodiments, a combination of the above-described approaches can be used, such as weighting power data more than weather data or vice versa.

Actual power data is received (block 304). This will be power data for a (or other time period). In solar embodiments, while a full day's worth of power data can be used for generating clusters, by the time a full day's worth of power data is received, there is no more sunlight for that day. The same is not true for embodiments used with wind power generation or other power generation sources that have a dependency on weather.

Power data for a partial day has actual power generation data that is gathered at predetermined intervals. For example, there can be power data received every hour, or every half-hour, or any other time interval. As discussed above, the length of the intervals has trade-offs. The use of more frequent intervals results in more accurate forecasts. However, the presence of more frequent intervals increases processing time.

After receiving the actual power generation data, the power generation data is compared against the previously generated clusters (block 306). In some embodiments, each cluster includes historical weather data and historical power generation data. In other embodiments, the cluster only includes historical power generation data.

Comparing the power generation data includes finding the cluster that most closely matches the actual power generation data. The comparison can be performed using a similarity calculation, such as the similarity calculations set forth in further detail above with respects to equations 1 through 4. For each cluster, a similarity score is calculated that compares the cluster with the actual power data. The cluster with the highest similarity score is the cluster that is most similar to the actual power data. The comparison can be performed using a supervised machine-learning algorithm. In such a manner, the actual power data can be stored for later use on future days. In some embodiments, this is stored along with actual weather data.

The comparison to previously generated clusters results in choosing one of the clusters. Thereafter, using the cluster data along with other data (such as the time of year to determine how long the sun will be up), an estimated solar power generation forecast is calculated for the remainder of the day (or other time period) (block 308). Remainder of the day can refer to the calendar day that occurs after the actual power generation data. For example, if the actual power generation data includes data from midnight through 9:00 am, the remainder of the day refers to the time period from 9:00 am to 11:59 pm. Other time periods can be used, such as half-days, other portions of days, or multiple days.

The calculation can be performed in any one of a number of manners. For example, a cluster can include data for one of many different time periods, such as an hourly forecast for how much electrical power will be generated for each hour. The time periods can be set to as fine a granularity as is needed to create a desired level of precision. In other words, once it has been found that the actual power data for the current date is most similar to graph 120 (for example), it is estimated that the power generation for that day also follows graph 120. The estimate of power generation can be adjusted for any change to the set of photovoltaics in question. The comparison to the clusters can include a comparison of weather forecasts in addition to the comparison of power data.

Once the solar power forecast is generated, it can be determined how much supplemental power is needed. For example, an electrical power company typically has an estimate of how much electrical power will be needed for a particular day. This can be estimated from prior usage, weather forecasts, day of the week, and the like, in a manner now known in the art or developed in the future. Once the power usage estimate is determined, the amount of supplemental power can be determined by subtracting the power usage estimate from the power generation estimate. The electrical power utility can then arrange to have the amount of supplemental power estimated. This can be performed by buying supplemental power from other utilities, or by using other sources of power that may be available to the electrical power utility.

In some embodiments, the solar power generation forecast generated in method 300 can be used to supplement the forecast generated in method 200. In other words, the amount of power that will be generated on Tuesday is forecast on Monday, based on the weather forecast for Tuesday. This solar power generation forecast can be supplemented on Tuesday morning when after a few pieces of actual solar power generation data is received. Because of a lag time in the ability to purchase power from a third party, a combination approach might be used. In other words, if an electric power company needs supplemental power for Tuesday, it might be too late to purchase supplemental power on Tuesday (when actual power numbers are available). However, the power utility might still be able to use internal reserve capacity (such as spinning reserve capacity, non-spinning (or supplemental) reserve, and replacement reserve). In such a manner, a weather forecast can be used to purchase power on the secondary market while the forecast using actual power data can be used for internal power generation.

While the above-described solution has been found to be effective, there can be refinements to the solution. Because the above-described solution relies on early morning power data (just after the sun rises) the data is not as accurate as it could be in some instances. It has been found that even more accurate results can be obtained through the use of actual solar power data in conjunction with a weighted algorithm to create a power forecast.

Figure 6:
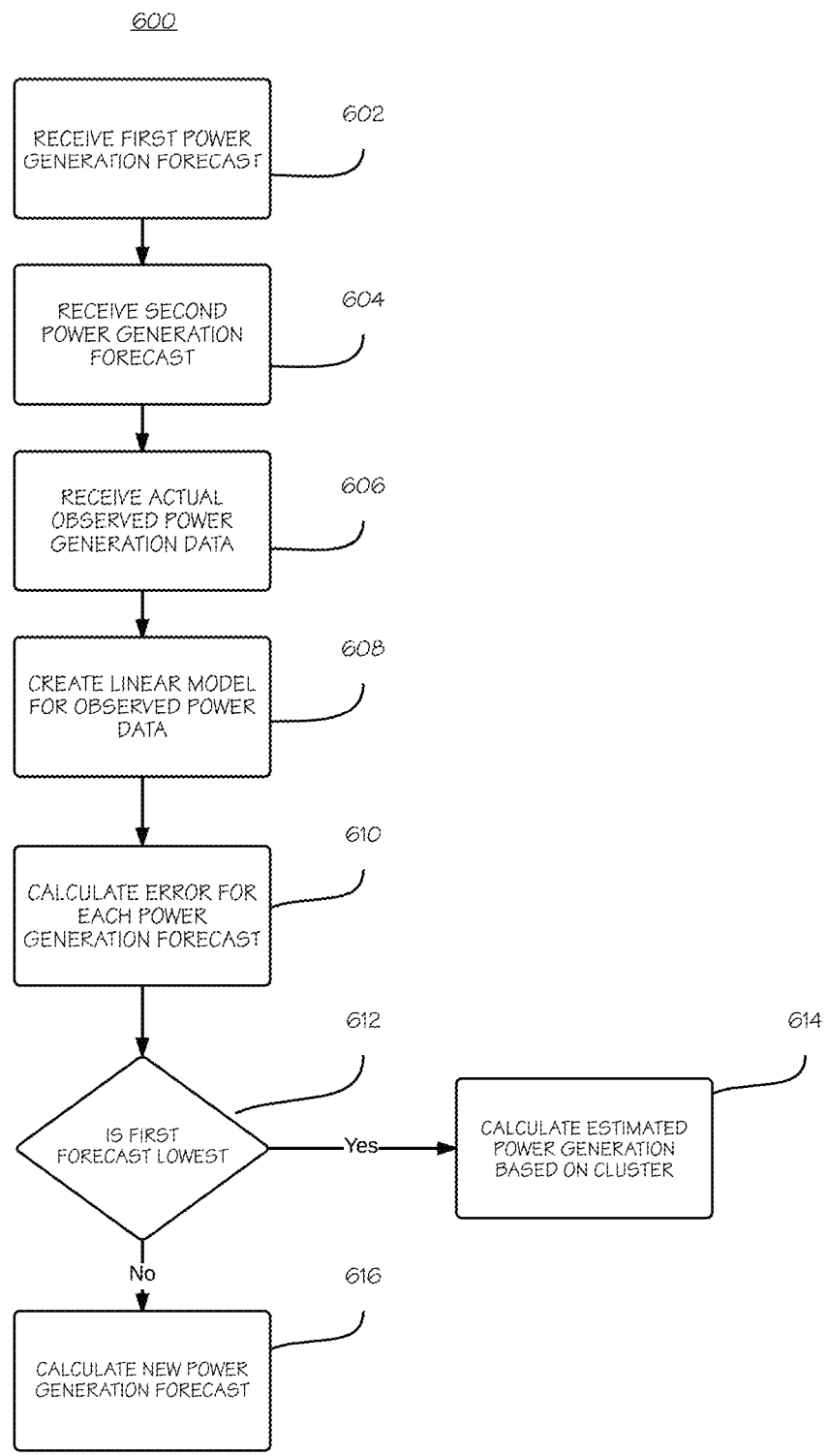
FIG. 6 depicts a flow diagram illustrating the operation of an embodiment.

Method 600 is an overview of a general method and is presented in FIG. 6. Method 600 is merely exemplary and is not limited to the embodiments presented herein. Method 600 can be employed in many different embodiments or examples not specifically depicted or described herein. In some embodiments, the procedures, processes, and/or activities of method 600 can be performed in the order presented. In other embodiments, one or more of the procedures, processes, and/or activities of method 600 can be combined or skipped. In some embodiments, portions of method 600 can be implemented by computer system 400.

A first predictive model for forecasting solar data (such as using method 200) is executed (block 602) and the results are termed the original power forecast ($P_{org}$) or the first power generation forecast. The predictive model is updated (such as using method 300), to result in a second power generation forecast ($P_{cl}$) (block 604). Actual observed power data ($P_{ob}$) is received (block 606).

Thereafter, a linear model is created to model the observed power data as a function of the second forecast. (block 608). The linear model can be expressed as follows:

$$P_{ob} = \beta \cdot P_{cl} + b$$

Where $\beta$ is a scaling factor between the second forecast and the observed power data. Once the $\beta$ scaling factor is determined, the scaled power ($P_{sc}$) forecast can be determined using the following equation:

$$P_{sc} = \hat{\beta} \cdot P_{cl} + \hat{b}$$

where $\hat{\beta}$ and $\hat{b}$ are learned from the linear model.

Thereafter, the mean absolute percent error (MAPE) is determined with respect to the actual, observed power (block 610). The MAPE is the absolute value of the (actual power−forecasted power) divided by the actual power. The results are $R_{org}$ (the error of the first power forecast), $R_{cl}$ (the error of the second power forecast), and $R_{sc}$ (the error of the scaled power forecast).

It is then determined if the error of the first forecast is the lowest (block 612). If so, then no changes are made (block 614).

If the error of the first forecast is not the lowest, then the forecast is adjusted to a new value (block 616). In some embodiments, this new value can be called the Nowcast, with the new power estimate denoted as $P_{nowcast}$. This value can also be considered the third power generation forecast. In some embodiments, the Nowcast is a weighted average of the scaled power forecast ($P_{sc}$) and the second power forecast ($P_{cl}$) as follows:

$$\omega_{sc} = \frac{R_{cl}}{R_{cl} + R_{sc}}$$

$$\omega_{cl} = 1 - \omega_{sc}$$

$$P_{nowcast} = \omega_{cl} * P_{cl} + \omega_{sc} * P_{sc}$$

Thus, $P_{nowcast}$ represents the latest power forecast. It is either the weighted average of a previous forecast and a scaled forecast, or it is the original power forecast. After the $P_{nowcast}$ forecast is generated, it is used in a manner such as those described above.

Figure 4:
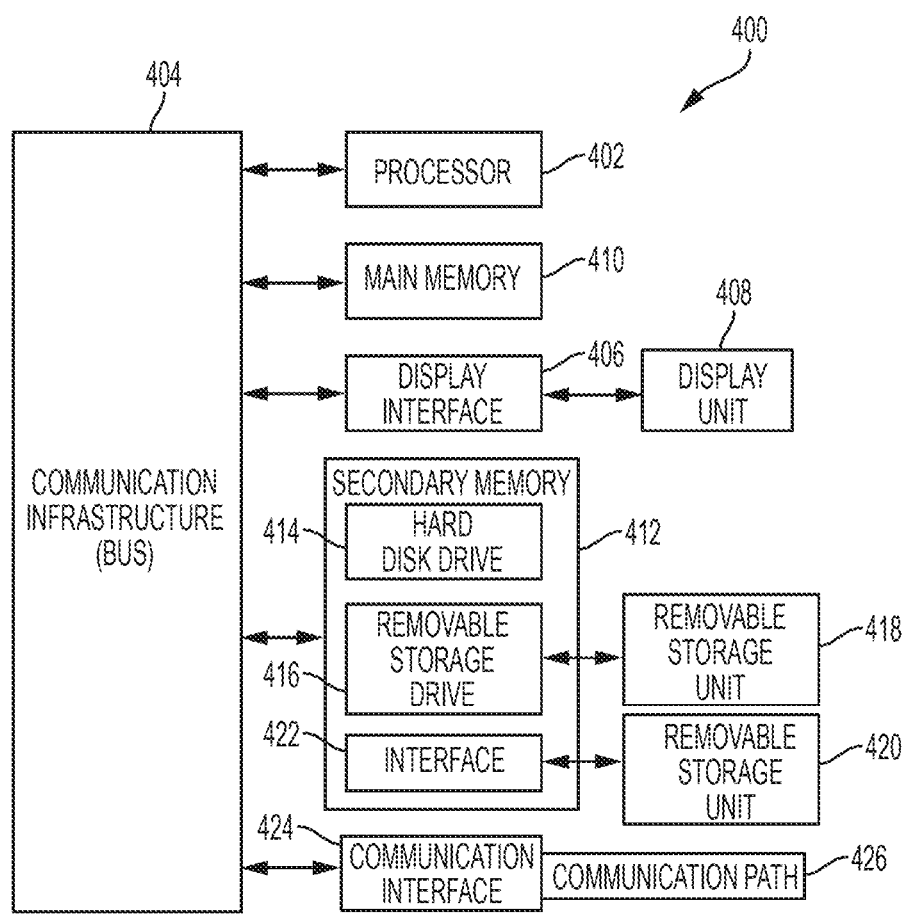
FIG. 4 depicts a computer system capable of implementing hardware components of one or more embodiments.

FIG. 4 depicts a high-level block diagram of a computer system 400, which can be used to implement one or more embodiments. More specifically, computer system 400 can be used to implement hardware components of systems capable of performing methods described herein. Although one exemplary computer system 400 is shown, computer system 400 includes a communication path 426, which connects computer system 400 to additional systems (not depicted) and can include one or more wide area networks (WANs) and/or local area networks (LANs) such as the Internet, intranet(s), and/or wireless communication network(s). Computer system 400 and additional system are in communication via communication path 426, e.g., to communicate data between them.

Computer system 400 includes one or more processors, such as processor 402. Processor 402 is connected to a communication infrastructure 404 (e.g., a communications bus, crossover bar, or network). Computer system 400 can include a display interface 406 that forwards graphics, textual content, and other data from communication infrastructure 404 (or from a frame buffer not shown) for display on a display unit 408. Computer system 400 also includes a main memory 410, preferably random access memory (RAM), and can also include a secondary memory 412.

Secondary memory 412 can include, for example, a hard disk drive 414 and/or a removable storage drive 416, representing, for example, a floppy disk drive, a magnetic tape drive, or an optical disc drive. Hard disk drive 414 can be in the form of a solid-state drive (SSD), a traditional magnetic disk drive, or a hybrid of the two. There also can be more than one hard disk drive 414 contained within secondary memory 412. Removable storage drive 416 reads from and/or writes to a removable storage unit 418 in a manner well known to those having ordinary skill in the art. Removable storage unit 418 represents, for example, a floppy disk, a compact disc, a magnetic tape, or an optical disc, etc. which is read by and written to by removable storage drive 416. As will be appreciated, removable storage unit 418 includes a computer-readable medium having stored therein computer software and/or data.

In alternative embodiments, secondary memory 412 can include other similar means for allowing computer programs or other instructions to be loaded into the computer system. Such means can include, for example, a removable storage unit 420 and an interface 422. Examples of such means can include a program package and package interface (such as that found in video game devices), a removable memory chip (such as an EPROM, secure digital card (SD card), compact flash card (CF card), universal serial bus (USB) memory, or PROM) and associated socket, and other removable storage units 420 and interfaces 422 which allow software and data to be transferred from the removable storage unit 420 to computer system 400.

Computer system 400 can also include a communications interface 424. Communications interface 424 allows software and data to be transferred between the computer system and external devices. Examples of communications interface 424 can include a modem, a network interface (such as an Ethernet card), a communications port, or a PC card slot and card, a universal serial bus port (USB), and the like. Software and data transferred via communications interface 424 are in the form of signals that can be, for example, electronic, electromagnetic, optical, or other signals capable of being received by communications interface 424. These signals are provided to communications interface 424 via communication path (i.e., channel) 426. Communication path 426 carries signals and can be implemented using wire or cable, fiber optics, a phone line, a cellular phone link, an RF link, and/or other communications channels.

In the present description, the terms "computer program medium," "computer usable medium," and "computer-readable medium" are used to refer to media such as main memory 410 and secondary memory 412, removable storage drive 416, and a hard disk installed in hard disk drive 414. Computer programs (also called computer control logic) are stored in main memory 410 and/or secondary memory 412. Computer programs also can be received via communications interface 424. Such computer programs, when run, enable the computer system to perform the features discussed herein. In particular, the computer programs, when run, enable processor 402 to perform the features of the computer system. Accordingly, such computer programs represent controllers of the computer system. Thus it can be seen from the forgoing detailed description that one or more embodiments provide technical benefits and advantages.

Figure 5:
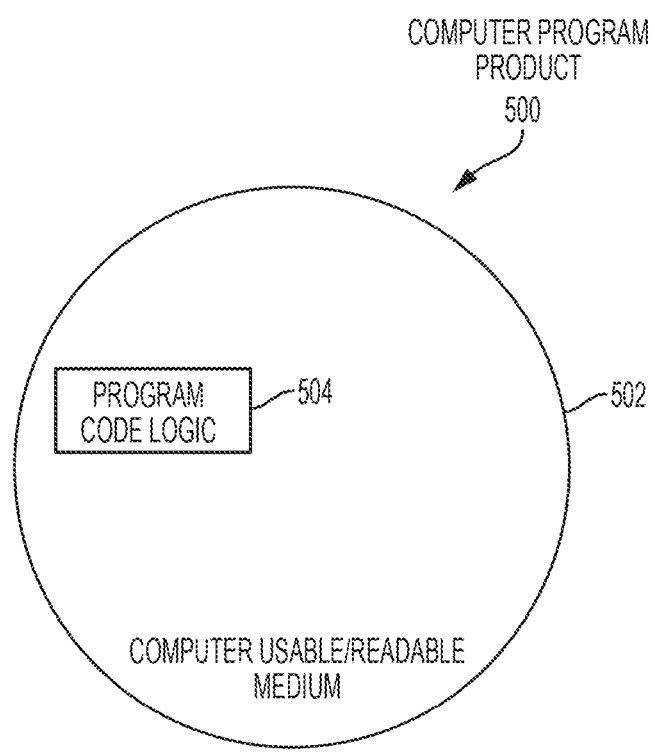
FIG. 5 depicts a diagram of a computer program product according to one or more embodiments.

Referring now to FIG. 5 a computer program product 500 in accordance with an embodiment that includes a computer-readable storage medium 502 and program instructions 504 is generally shown.

Embodiments can be a system, a method, and/or a computer program product at any possible technical detail level of integration. The computer program product can include a computer-readable storage medium (or media) having computer-readable program instructions thereon for causing a processor to carry out aspects of embodiments of the present invention.

The computer-readable storage medium can be a tangible device that can retain and store instructions for use by an instruction execution device. The computer-readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out embodiments can include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer-readable program instructions by utilizing state information of the computer-readable program instructions to personalize the electronic circuitry, in order to perform embodiments of the present invention.

Aspects of various embodiments are described herein with reference to flowchart illustrations and/or block diagrams of methods, apparatus (systems), and computer program products according to various embodiments. It will be understood that each block of the flowchart illustrations and/or block diagrams, and combinations of blocks in the flowchart illustrations and/or block diagrams, can be implemented by computer-readable program instructions.

These computer-readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions can also be stored in a computer-readable storage medium that can direct a computer, a programmable data processing apparatus, and/or other devices to function in a particular manner, such that the computer-readable storage medium having instructions stored therein includes an article of manufacture including instructions which implement aspects of the function/act specified in the flowchart and/or block diagram block or blocks.

The computer-readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The descriptions presented herein are for purposes of illustration and description, but is not intended to be exhaustive or limited. Many modifications and variations will be apparent to those of ordinary skill in the art without departing from the scope and spirit of embodiments of the invention. The embodiment was chosen and described in order to best explain the principles of operation and the practical application, and to enable others of ordinary skill in the art to understand embodiments of the present invention for various embodiments with various modifications as are suited to the particular use contemplated.

What is claimed is:

1. A computer-implemented method of forecasting power generation, the method comprising:
   receiving, using a processor, a first power generation forecast;
   creating, using the processor, a second power generation forecast, wherein the second power generation forecast is created by:
      analyzing, using the processor, a set of historical power generation data;
      determining, using the processor, a set of clusters, wherein each cluster of the set of clusters represents power generated during a time period;
      receiving, using the processor, power generation data for a portion of the time period;
      identifying, using the processor, a cluster of the set of clusters that contains historical power generation data that is most similar to the power generation data; and forecasting, using the processor, power generation for a remainder of the time period, using the historical power generation data of the cluster of the set of clusters to determine the second power generation forecast;

receiving, using the processor, an observed power generation;

creating, using the processor, a model for the observed power generation based on the second power generation forecast;

calculating a first error between the first power generation forecast and the observed power generation;

calculating a second error between the model for the observed power generation and the observed power generation; and creating, using the processor, a third power generation forecast based on a determination that the first error is lower than the second error, the third power generation forecast comprises a weighted average of the second power generation forecast and the model for the observed power generation.

2. The computer-implemented method of claim 1, wherein creating a weighted average comprises:

calculating a first weight and a second weight using the second power generation forecast and the model for the observed power generation; and calculating the weighted average by summing the product of the first weight and the second power generation forecast with the product of the second weight and the model for the observed power generation.

3. A computer system for forecasting power generation, the system comprising:

a memory; and a processor system communicatively coupled to the memory;

the processor system configured to perform a method comprising:

receiving a first power generation forecast;

creating a second power generation forecast by:

analyzing a set of historical power generation data;

determining a set of clusters, wherein each cluster of the set of clusters represents power generated during a time period;

receiving power generation data for a portion of the time period;

identifying a cluster of the set of clusters that contains historical power generation data that is most similar to the power generation data; and forecasting power generation for a remainder of the time period, using the historical power generation data of the cluster of the set of clusters to determine the second power generation forecast;

receiving observed power generation;

creating a model for the observed power generation based on the second power generation forecast;

calculating a first error between the first power generation forecast and the observed power generation;

calculating a second error between the model for the observed power generation and the observed power generation; and creating a third power generation forecast based on a determination that the first error is lower than the second error, the third power generation forecast comprises a weighted average of the second power generation forecast and the model for the observed power generation.

4. The computer system of claim 3, wherein creating a weighted average comprises:

calculating a first weight and a second weight using the second power generation forecast and the model for the observed power generation; and calculating the weighted average by summing the product of the first weight and the second power generation forecast with the product of the second weight and the model for the observed power generation.

5. A computer program product for forecasting power generation comprising:

a computer-readable storage medium having program instructions embodied therewith, the program instructions readable by a processor system to cause the processor system to perform a method comprising:

receiving a first power generation forecast;

creating a second power generation forecast by:

analyzing a set of historical power generation data;

determining a set of clusters, wherein each cluster of the set of clusters represents power generated during a time period;

receiving power generation data for a portion of the time period;

identifying a cluster of the set of clusters that contains historical power generation data that is most similar to the power generation data; and forecasting power generation for a remainder of the time period, using the historical power generation data of the cluster of the set of clusters to determine the second power generation forecast;

receiving observed power generation;

creating a model for the observed power generation based on the second power generation forecast;

calculating a first error between the first power generation forecast and the observed power generation;

calculating a second error between the model for the observed power generation and the observed power generation; and creating a third power generation forecast based on a determination that the first error is lower than the second error, the third power generation forecast comprises a weighted average of the second power generation forecast and the model for the observed power generation.

6. The computer program product of claim 5, wherein:

creating a third power generation forecast comprises creating a weighted average of the second power generation forecast and the model for the observed power generation; and creating a weighted average comprises:

calculating a first weight and a second weight using the second power generation forecast and the model for the observed power generation; and calculating the weighted average by summing the product of the first weight and the second power generation forecast with the product of the second weight and the model for the observed power generation.

* * * * *